(12) United States Patent
Guo et al.

(10) Patent No.: US 10,058,016 B2
(45) Date of Patent: Aug. 21, 2018

(54) COMPENSATION OF MAGNETIC INTERFERENCE

(71) Applicant: Apple Inc., Cupertino, CA (US)

(72) Inventors: Jian Guo, Milpitas, CA (US); Sean M. Gordoni, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 96 days.

(21) Appl. No.: 15/273,613

(22) Filed: Sep. 22, 2016

(65) Prior Publication Data

US 2018/0084681 A1 Mar. 22, 2018

(51) Int. Cl.
| | |
|---|---|
| *G01C 17/38* | (2006.01) |
| *H05K 9/00* | (2006.01) |
| *H01L 43/02* | (2006.01) |
| *H01L 27/22* | (2006.01) |
| *H05K 1/02* | (2006.01) |
| *H05K 1/18* | (2006.01) |
| *H05K 1/11* | (2006.01) |
| *H01F 7/06* | (2006.01) |
| *H04R 29/00* | (2006.01) |
| *G01R 33/00* | (2006.01) |

(52) U.S. Cl.
CPC ....... *H05K 9/0071* (2013.01); *G01R 33/0017* (2013.01); *H01F 7/064* (2013.01); *H01L 27/22* (2013.01); *H01L 43/02* (2013.01); *H04R 29/003* (2013.01); *H05K 1/0216* (2013.01); *H05K 1/115* (2013.01); *H05K 1/181* (2013.01); *H05K 2201/1003* (2013.01); *H05K 2201/10151* (2013.01)

(58) Field of Classification Search
CPC ..................................................... G01C 17/38
USPC ..................................................... 33/356, 357
See application file for complete search history.

(56) References Cited

U.S. PATENT DOCUMENTS

| | | | |
|---|---|---|---|
| 6,222,363 B1* | 4/2001 | Cripe | G01L 3/102 |
| | | | 324/225 |
| 2012/0296596 A1* | 11/2012 | Profitt | G06F 3/0346 |
| | | | 702/104 |
| 2013/0104410 A1 | 5/2013 | Wade et al. | |
| 2013/0307547 A1* | 11/2013 | Honkura | G01C 17/38 |
| | | | 324/345 |
| 2016/0084652 A1* | 3/2016 | Sekitsuka | G01C 17/38 |
| | | | 702/94 |
| 2016/0370179 A1* | 12/2016 | Goetzke | G01C 17/38 |

(Continued)

*Primary Examiner* — G. Bradley Bennett
(74) *Attorney, Agent, or Firm* — Fish & Richardson P.C.

(57) ABSTRACT

A compensation coil placed at least partially underneath a magnetic field sensor package in an electronic system provides attenuation of electromagnetic interference (EMI). In an embodiment, the compensation coil attenuates EMI in a frequency band which overlaps with an operating frequency band of the magnetic field sensor. This allows the magnetic field sensor to make accurate magnetic field measurements in the presence of system level alternating current (AC) EMI. In an embodiment, a system comprises: a magnetic field sensor; a compensation coil placed at least partially underneath the magnetic field sensor; and a reverse current generator coupled to the compensation coil and to a power supply that is coupled to an electromagnetic interference (EMI) source, the reverse current generator operable to generate a reverse current in the compensation coil to generate a counter magnetic field for compensating the EMI.

20 Claims, 5 Drawing Sheets

(56) References Cited

U.S. PATENT DOCUMENTS

2017/0199034 A1* 7/2017 Waters .................. G01C 17/38
2017/0285082 A1* 10/2017 Guo ...................... G01R 27/02
2018/0058857 A1* 3/2018 Yost ..................... G01C 21/165

* cited by examiner

COMPENSATION OF MAGNETIC INTERFERENCE

TECHNICAL FIELD

This disclosure relates generally to compensating for electromagnetic interference (EMI) in electronic systems.

BACKGROUND

EMI affects an electronic system by electromagnetic induction, electrostatic coupling or conduction. EMI can be problematic in, for example, electronic systems that include several EMI sources integrated within the same housing as a digital magnetic compass. A typical earth magnetic field ranges between 25 µT~62 µT, depending on the geographical location. To maintain an acceptable heading error (e.g., <10° heading error) for the magnetic compass typically requires EMI to be in the range of 2 µT~6 µT. In some electronic systems having a small form factor (e.g., a smartphone), a magnetometer sensor package may be located close (e.g., several millimeters) to one or more EMI sources (e.g., a voice coil in a telephone receiver module). The EMI is frequency dependent and can have an amplitude as high as ~22 µT. This large EMI could result in a large magnetic compass heading error (e.g., up to 90° heading error), impacting the performance of applications, such as gaming and navigation applications, that use multi-axis magnetometers to determine direction or compensate for errors in other sensors (e.g., compensate gyro sensors).

SUMMARY

In an embodiment, a system comprises: a magnetic field sensor; a compensation coil placed at least partially underneath the magnetic field sensor; and a reverse current generator coupled to the compensation coil and to a power supply that is coupled to an EMI source, the reverse current generator operable to generate a reverse current in the compensation coil to generate a counter magnetic field for compensating the EMI.

In an embodiment, a system comprises: a power supply; a voice coil coupled to the power supply for receiving a first current from the power supply; a magnetic field sensor; a compensation coil placed at least partially underneath the magnetic field sensor; and a reverse current generator coupled to the compensation coil and to the power supply, the reverse current generator operable to generate a second current in the compensation coil that is opposite the first current to generate a counter magnetic field for compensating electromagnetic interference (EMI) generated by the voice coil in a frequency band which overlaps with an operating frequency band of the magnetic field sensor.

Particular embodiments disclosed herein provide one or more of the following advantages. A compensation coil placed underneath a sensor package in an electronic system provides attenuation of EMI generated from an EMI source, such as a voice coil of a loudspeaker. The compensation coil is driven by a reverse current generator coupled to a power supply of the EMI source to generate a counter magnetic field that attenuates the EMI in a frequency band (e.g., an audio frequency band) that overlaps with the operating frequency band of a multi-axis magnetometer (e.g., 2 or 3-axis magnetometer). This allows the magnetometer sensor to make accurate magnetic field measurements in the presence of system level alternating current (AC) EMI.

The details of the disclosed embodiments are set forth in the accompanying drawings and the description below. Other features, objects and advantages are apparent from the description, drawings and claims.

DESCRIPTION OF DRAWINGS

The same reference symbol used in various drawings indicates like elements.

DETAILED DESCRIPTION

Embodiments are disclosed for a system level AC EMI compensation system that includes a compensation coil integrated in multiple layers of a printed circuit board (PCB) placed at least partially underneath a magnetic sensor package.

In an embodiment, the compensation coil generates a counter magnetic field against the EMI source. The direction of the counter magnetic field can be manipulated by utilizing a reverse current generator coupled (e.g., coupled in parallel) to a power supply of the EMI source. The reverse current generator reverses the current flow direction within the compensation coil. The direction of the counter magnetic field can also be manipulated by adjusting the winding direction of the compensation coil.

In an embodiment, the placement of the compensation coil underneath a multi-axis magnetic sensor package takes advantage of coil symmetry to focus the counter magnetic field along a desired sense axis while substantially cancelling components of the counter magnetic field along other sense axes. The disclosed embodiments are suitable for use in any electronic systems (e.g., smartphones, tablet computers, gaming devices, wearable devices, navigation devices) that include magnetometer sensors or other sensors that are susceptible to EMI.

Example EMI Compensation System

Figure 1:
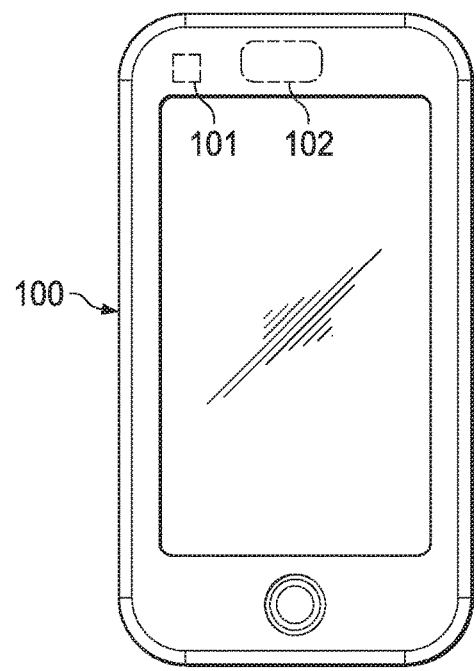
FIG. 1 illustrates an example electronic system that could benefit from an EMI compensation system, according to an embodiment.

FIG. 1 illustrates an example electronic system 100 that could benefit from an EMI compensation system, according to an embodiment. In the example embodiment shown, system 100 is a smartphone that includes magnetic sensor 101 and EMI source 102. For example, magnetic sensor 101 can be a multi-axis magnetometer (e.g., 2 or 3-axis magnetometer) and EMI source 102 can be a telephone receiver module with a coil that radiates EMI in the audio frequency band. Although the example electronic system 100 described is a smartphone, the disclosed embodiments are applicable to any electronic system or device that could benefit from compensation of EMI, including but not limited to notebook computers, tablet computers, gaming devices, digital cameras/camcorders, vehicle navigation systems and wearable devices (e.g., smart watches, smart glasses, fitness devices). EMI source 102 can be any component that generates EMI in the audio frequency band.

Figure 2:
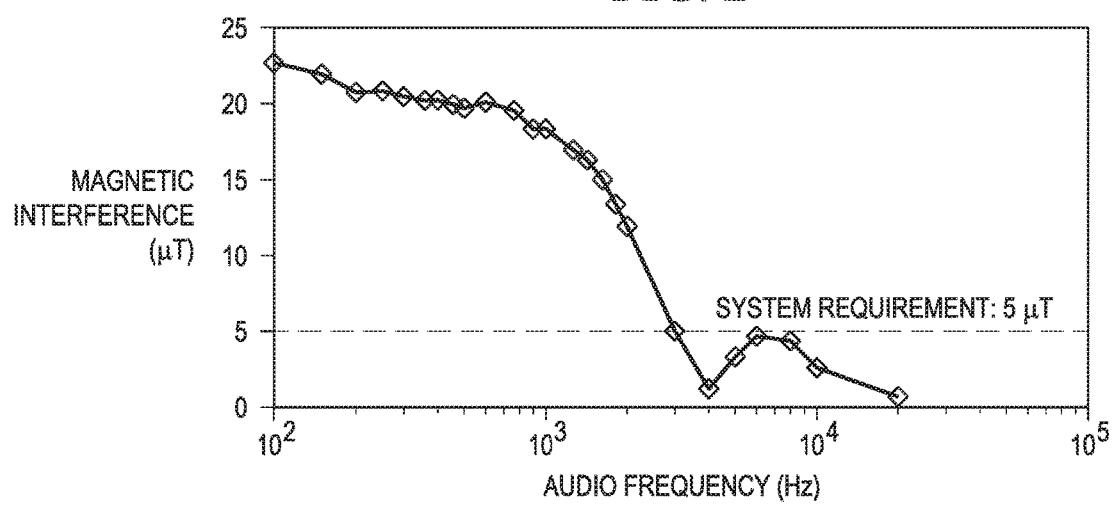
FIG. 2 is a example plot illustrating EMI as a function of frequency without EMI compensation, according to an embodiment.

FIG. 2 is an example Bode plot illustrating EMI as a function of frequency without EMI compensation, according to an embodiment. The vertical axis of the plot shows magnetic interference (µT) and the horizontal axis is the logarithm of frequency (Hz). As can be observed from the plot the level of EMI is significantly higher than the example system requirement of 5 µT in the audio frequency band. For example, if the user is engaged in a telephone call the voice coil in the receiver module can generate significant EMI in the audio frequency band. Because the EMI is in the operating frequency range of the magnetometer it is sensed by the magnetometer sensors, resulting in a large heading error in a magnetic compass (e.g., as high as 90°). One solution would be for the sensor to take magnetic measurements only when the EMI source is inactive. Deactivating an EMI source, however, is not desirable for many applications such as gaming or virtual reality applications that rely on a digital compass or motion sensors. In the description that follows, a compensation coil is described that compensates for EMI in the audio frequency band without compromising the performance of applications that rely on magnetometer measurements.

Figure 3:
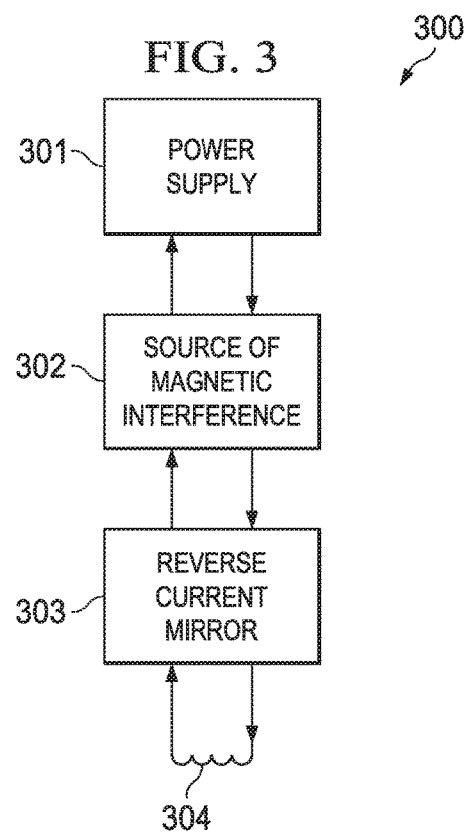
FIG. 3 is a conceptual block diagram illustrating an example EMI compensation system, according to an embodiment.

FIG. 3 is a conceptual block diagram illustrating an example EMI compensation system 300, according to an embodiment. System 300 includes power supply 301, EMI source 302, reverse current generator 303 and compensation coil 304. Reverse current generator 303 and compensation coil 304 are coupled in parallel to power supply 301.

Power supply 301 provides current to EMI source 302 (e.g., a voice or speaker coil) and reverse current generator 303 reverses the current in compensation coil 304 so that the direction of current flow in compensation coil 304 is opposite to the direction of current flow into EMI source 302. In an embodiment, reverse current generator 303 includes one or more switches operable to reverse the connection to the power supply. In other embodiments, other circuitry can be used to generate an opposite current (180° out of phase with power supply current) in compensation coil 304. When supplied with current compensation coil 304 generates a counter magnetic field that substantially cancels out the EMI generate by EMI source 302.

Figure 4:
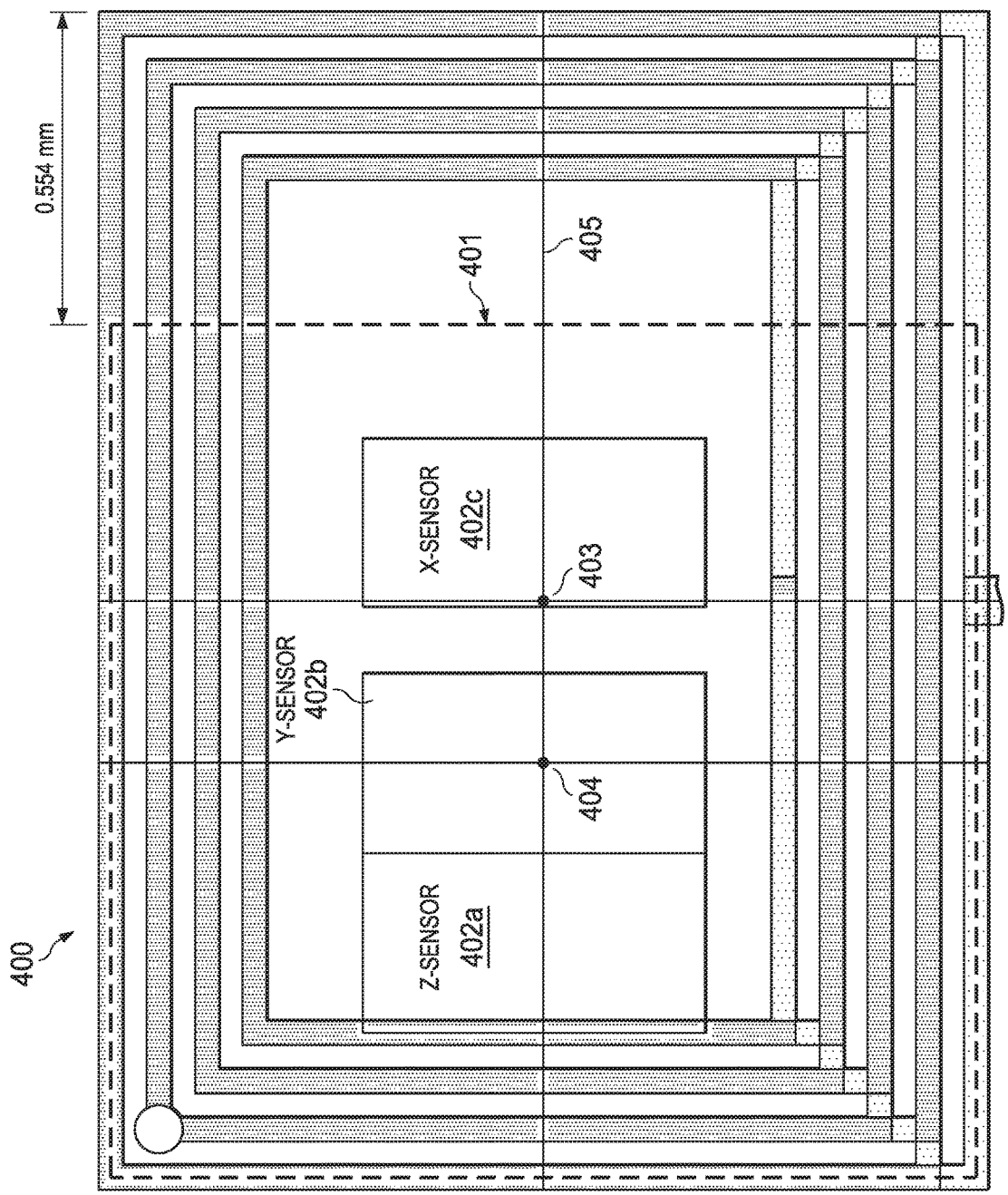
FIG. 4 is a top view of a compensation coil, according to an embodiment.

FIG. 4 is a top view of compensation coil 400, according to an embodiment. Compensation coil 400 is a three-dimensional (3D) solenoid structure that is placed underneath magnetometer package 401 and can be integrated in multiple layers of a PCB. A solenoid is a coil of wire designed to create a strong magnetic field inside the coil. The number of turns of the coil of wire refers to the number of loops of the solenoid. More loops will bring about a stronger magnetic field.

In this example, magnetometer package 401 houses three sensors 402a-402c for sensing in three different sense axes (x, y, z). Note that the positive +z direction is into the page. To reduce the foot print of compensation coil 400 and to take advantage of symmetry, the width W of compensation coil 400 is made coextensive with the width of package 401, as shown in FIG. 4. Additionally, center 403 of compensation coil 400 is offset from center 404 of package 401 to ensure maximum compensation along the z-axis while minimizing unwanted interference along the x and y axes. The number of turns of wire per layer is selected to reduce current consumption. For example, compensation coil 400 can have a total of 16 turns of wire integrated into 4 PCB layers, where each PCB layer has 4 turns of wire. Other compensation coil designs can have more or fewer layers and more or fewer turns of wire per layer.

The placement of compensation coil 400 underneath sensors 402a-402c takes advantage of the symmetry of compensation coil 400 to maximize the z-axis component of the counter magnetic field and substantially cancel the x-axis and y-axis components of the counter magnetic field. Compensation coil 400 can be divided into two regions by imaginary line 405. By aligning sensor 402b (y-axis sensor) so it is symmetric (evenly divided) along imaginary line 405 the magnetic fluxes flowing in the y-axis direction from the two regions substantially cancel out. In some cases, sensor 402c (x-axis sensor) is not located at center 404 of package 401. To create symmetry in the x-axis direction, a length L of compensation coil 400 is extended beyond the package 401 boundary in the x-axis so that center 403 of compensation coil 400 overlies sensor 402c. This arrangement allows the magnetic fluxes flowing in the x-axis direction to substantially cancel out.

Note that the desired to maximize compensation on the z-axis component is due to the layout of electronic system 100. In a smartphone, for example, the EMI source is a coil that lies in the same plane as the compensation coil and generates a magnetic field in the z direction as expected for a solenoid structure. For other electronic systems it may be desirable to focus the maximum compensation in the x direction or y direction depending on the position and orientation of the EMI source relative to the position and orientation of the compensation coil. Note that the x, y, z coordinate system disclosed herein is only an example and other reference coordinate frames can be used.

Figure 5:
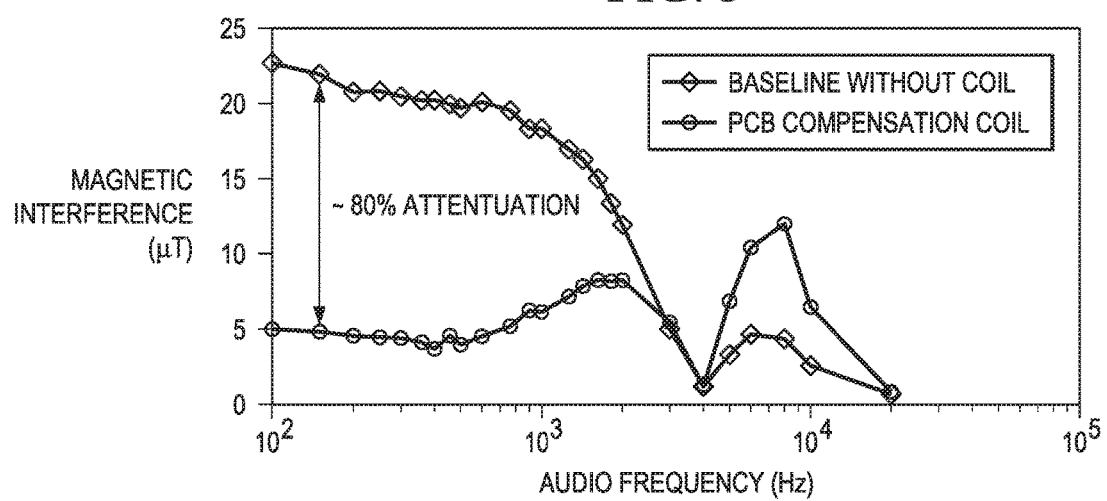
FIG. 5 is a example plot illustrating EMI as a function of frequency with EMI compensation, according to an embodiment.

FIG. 5 is a example Bodie plot illustrating EMI as a function of frequency with EMI compensation, according to an embodiment. The plot from FIG. 2 is included as baseline (without compensation coil) for comparison purposes. As can be observed from the plot in FIG. 5, the magnetic interference in the lower part of the audio frequency band has been attenuated by about 80%, confirming the expected benefits of EMI compensation system 300.

Figure 6A:
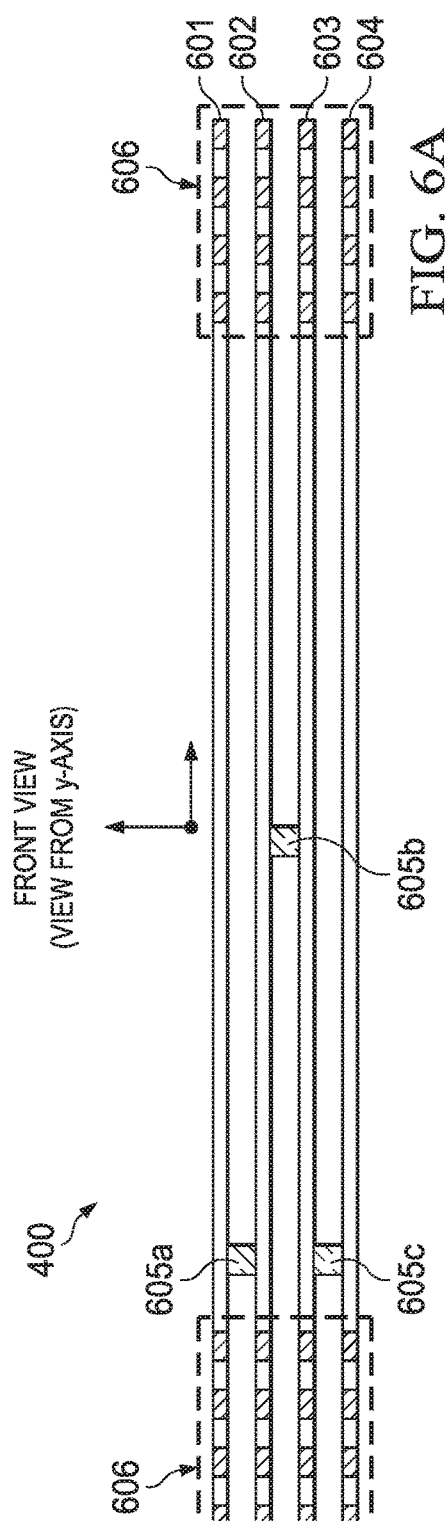
FIG. 6A is a side view of the compensation coil of FIG. 4, according to an embodiment.
Figure 6B:
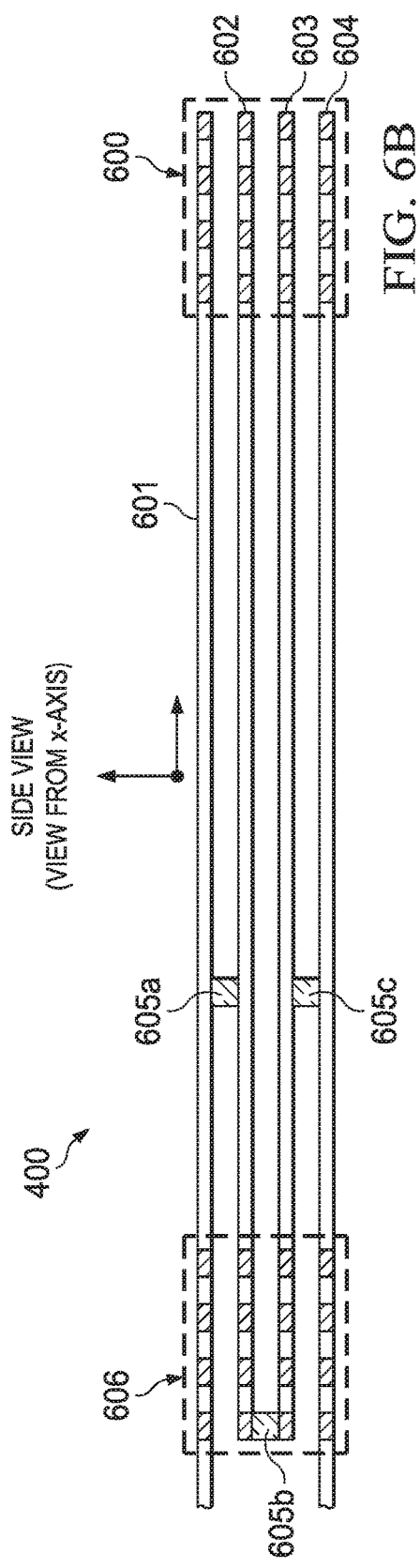
FIG. 6B is a front view of the compensation coil of FIG. 4, according to an embodiment.

FIG. 6A is a front view of compensation coil 400 from the y-axis, according to an embodiment. In this view the 4 PCB layers 601-604 of the compensation coil 400 are shown including coil wires 606. Vias 605a-605c are for connecting PCB traces from different PCB layers. FIG. 6B is a side view of compensation coil 400 from the x-axis, according to an embodiment. In this view, the internal coil layers are shown connected through vias 605a-605c.

Example Device Architecture

Figure 7:
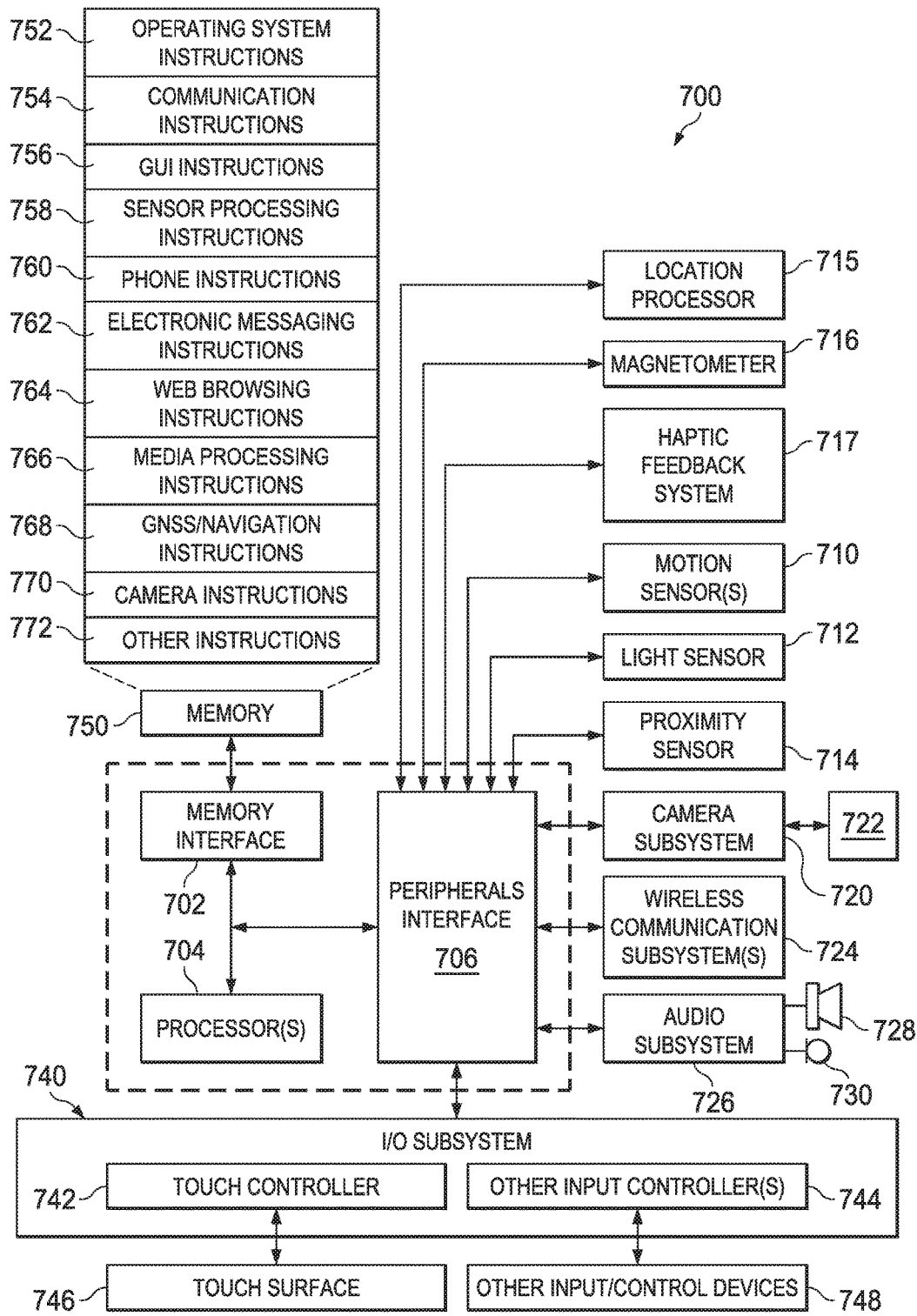
FIG. 7 is a block diagram of an example electronic system architecture, according to an embodiment.

FIG. 7 is a block diagram of an electronic system architecture 700. Architecture 700 may include memory interface 702, data processor(s), image processor(s) or central processing unit(s) 704, and peripherals interface 706. Memory interface 702, processor(s) 704 or peripherals interface 706 may be separate components or may be integrated in one or more integrated circuits. One or more communication buses or signal lines may couple the various components.

Sensors, devices, and subsystems may be coupled to peripherals interface 706 to facilitate multiple functionalities. For example, motion sensor(s) 710, light sensor 712, and proximity sensor 714 may be coupled to peripherals interface 706 to facilitate orientation, lighting, and proximity functions of the device. For example, in some embodiments, light sensor 712 may be utilized to facilitate adjusting the brightness of touch surface 746. In some embodiments, motion sensor(s) 710 (e.g., an accelerometer, rate gyroscope) may be utilized to detect movement and orientation of the device. Accordingly, display objects or media may be presented according to a detected orientation (e.g., portrait or landscape). Haptic feedback system 717, under the control of haptic feedback instructions 772, provides haptic feedback in the form of vibration.

Other sensors may also be connected to peripherals interface 706, such as a temperature sensor, a barometer, a biometric sensor, or other sensing device, to facilitate related functionalities. For example, a biometric sensor can detect fingerprints and monitor heart rate and other fitness parameters.

Location processor 715 (e.g., GNSS receiver chip) may be connected to peripherals interface 706 to provide georeferencing. Electronic magnetometer 716 (e.g., an integrated circuit chip) may also be connected to peripherals interface 706 to provide data that may be used to determine the direction of magnetic North. Thus, electronic magnetometer 716 may be used as an electronic compass. Electronic magnetometer can be a multi-axis magnetometer that includes a compensation coil as described in reference to FIGS. 1-6.

Camera subsystem 720 and an optical sensor 722, e.g., a charged coupled device (CCD) or a complementary metal-oxide semiconductor (CMOS) optical sensor, may be utilized to facilitate camera functions, such as recording photographs and video clips.

Communication functions may be facilitated through one or more communication subsystems 724. Communication subsystem(s) 724 may include one or more wireless communication subsystems. Wireless communication subsystems 724 may include radio frequency receivers and transmitters and/or optical (e.g., infrared) receivers and transmitters. Wired communication systems may include a port device, e.g., a Universal Serial Bus (USB) port or some other wired port connection that may be used to establish a wired connection to other computing devices, such as other communication devices, network access devices, a personal computer, a printer, a display screen, or other processing devices capable of receiving or transmitting data.

The specific design and embodiment of the communication subsystem 724 may depend on the communication network(s) or medium(s) over which the device is intended to operate. For example, a device may include wireless communication subsystems designed to operate over a global system for mobile communications (GSM) network, a GPRS network, an enhanced data GSM environment (EDGE) network, IEEE802.xx communication networks (e.g., Wi-Fi, Wi-Max, ZigBee™), 3G, 4G, 4G LTE, code division multiple access (CDMA) networks, near field communication (NFC), Wi-Fi Direct and a Bluetooth™ network. Wireless communication subsystems 724 may include hosting protocols such that the device may be configured as a base station for other wireless devices. As another example, the communication subsystems may allow the device to synchronize with a host device using one or more protocols or communication technologies, such as, for example, TCP/IP protocol, HTTP protocol, UDP protocol, ICMP protocol, POP protocol, FTP protocol, IMAP protocol, DCOM protocol, DDE protocol, SOAP protocol, HTTP Live Streaming, MPEG Dash and any other known communication protocol or technology.

Audio subsystem 726 may be coupled to a speaker 728 and one or more microphones 730 to facilitate voice-enabled functions, such as voice recognition, voice replication, digital recording, and telephony functions. Speaker 728 includes a voice/speaker coil that generates EMI as described in reference to FIGS. 1-8, and is therefore an example of an EMI source.

I/O subsystem 740 may include touch controller 742 and/or other input controller(s) 744. Touch controller 742 may be coupled to a touch surface 746. Touch surface 746 and touch controller 742 may, for example, detect contact and movement or break thereof using any of a number of touch sensitivity technologies, including but not limited to, capacitive, resistive, infrared, and surface acoustic wave technologies, as well as other proximity sensor arrays or other elements for determining one or more points of contact with touch surface 746. In one embodiment, touch surface 746 may display virtual or soft buttons and a virtual keyboard, which may be used as an input/output device by the user.

Other input controller(s) 744 may be coupled to other input/control devices 748, such as one or more buttons, rocker switches, thumb-wheel, infrared port, USB port, and/or a pointer device such as a stylus. The one or more buttons (not shown) may include an up/down button for volume control of speaker 728 and/or microphone 730.

In some embodiments, device 700 may present recorded audio and/or video files, such as MP3, AAC, and MPEG video files. In some embodiments, device 700 may include the functionality of an MP3 player and may include a pin connector for tethering to other devices. Other input/output and control devices may be used.

Memory interface 702 may be coupled to memory 750. Memory 750 may include high-speed random access memory or non-volatile memory, such as one or more magnetic disk storage devices, one or more optical storage devices, or flash memory (e.g., NAND, NOR). Memory 750 may store operating system 752, such as Darwin, RTXC, LINUX, UNIX, OS X, iOS, WINDOWS, or an embedded operating system such as VxWorks. Operating system 752 may include instructions for handling basic system services and for performing hardware dependent tasks. In some embodiments, operating system 752 may include a kernel (e.g., UNIX kernel).

Memory 750 may also store communication instructions 754 to facilitate communicating with one or more additional devices, one or more computers or servers, including peer-to-peer communications. Communication instructions 754 may also be used to select an operational mode or communication medium for use by the device, based on a geographic location (obtained by the GPS/Navigation instructions 768) of the device.

Memory 750 may include graphical user interface instructions 756 to facilitate graphic user interface processing, including a touch model for interpreting touch inputs and gestures; sensor processing instructions 758 to facilitate sensor-related processing and functions; phone instructions 760 to facilitate phone-related processes and functions; electronic messaging instructions 762 to facilitate electronic-messaging related processes and functions; web browsing instructions 764 to facilitate web browsing-related processes and functions; media processing instructions 766 to facilitate media processing-related processes and functions; GNSS/Navigation instructions 768 to facilitate GNSS (e.g., GPS, GLOSSNAS) and navigation-related processes and functions; camera instructions 770 to facilitate camera-related processes and functions; and other instructions 772 for implementing one or more applications including, for example, a virtual reality application, gaming application, navigation application or an electronic compass application.

Each of the above identified instructions and applications may correspond to a set of instructions for performing one or more functions described above. These instructions need not be implemented as separate software programs, procedures, or modules. Memory 750 may include additional instructions or fewer instructions. Furthermore, various functions of the device may be implemented in hardware and/or in software, including in one or more signal processing and/or application specific integrated circuits (ASICs).

A number of embodiments have been described. Nevertheless, it will be understood that various modifications may be made. Elements of one or more embodiments may be combined, deleted, modified, or supplemented to form further embodiments. In yet another example, the logic flows depicted in the figures do not require the particular order shown, or sequential order, to achieve desirable results. In addition, other steps may be provided, or steps may be eliminated, from the described flows, and other components may be added to, or removed from, the described systems. Accordingly, other embodiments are within the scope of the following claims.

What is claimed is:

1. A system comprising:
   a magnetic field sensor;
   a compensation coil placed at least partially underneath the magnetic field sensor; and
   a reverse current generator coupled to the compensation coil and to a power supply that is coupled to an electromagnetic interference (EMI) source, the reverse current generator operable to generate a reverse current in the compensation coil to generate a counter magnetic field for compensating the EMI.

2. The system of claim 1, wherein the magnetic sensor is a multi-axis digital magnetometer and the compensation coil is placed underneath the magnetometer at a position that allows for compensation along a first axis of the multi-axis digital magnetometer by the counter magnetic field and at least partial cancelling of the counter magnetic field along at least a second axis of the multi-axis digital magnetometer.

3. The system of claim 1, wherein the magnetic sensor is a multi-axis digital magnetometer and the compensation coil is placed underneath the magnetometer at an offset from a center of the multi-axis magnetometer to allow maximum compensation along a first sense axis of the multi-axis magnetometer and minimum compensation along at least a second sense axis of the multi-axis magnetometer.

4. The system of claim 1, wherein at least one dimension of the compensation coil is coextensive with at least one dimension of an integrated circuit package housing the magnetic sensor.

5. The system of claim 1, wherein the magnetic field sensor is included in an integrated circuit package and a length of the compensation coil is extended beyond a package boundary so the compensation coil overlies at least one sensor of the magnetic field sensor.

6. The system of claim 1, wherein the compensation coil is integrated into multiple layers of a printed circuit board (PCB) underneath the magnetic field sensor.

7. The system of claim 6, wherein the compensation coil is integrated into at least four layers of the PCB.

8. The system of claim 6, further comprising one or more vias connecting PCB traces from different PCB layers.

9. The system of claim 6, wherein the compensation coil is a three-dimensional (3D) solenoid structure.

10. The system of claim 6, wherein a number of turns of coil wire per layer is selected to reduce current consumption.

11. The system of claim 1, wherein a direction of the counter field is controlled at least in part by a winding direction of the compensation coil.

12. The system of claim 1, wherein in the system is included in an electronic device and further comprises:
    a processor coupled to the magnetic sensor and operable to read magnetic field measurements provided by the magnetic field sensor; and
    memory coupled to the processor storing instructions, which, when executed by the processor, causes the processor to calculate a compass heading and present the compass heading on the electronic device using at least one of display, audio or force feedback.

13. The system of claim 1, wherein the reverse current generator is coupled in parallel with the power supply and includes one or more switches operable to reverse a connection to the power supply.

14. A system comprising:
    a power supply;
    a voice coil coupled to the power supply for receiving a first current from the power supply;
    a magnetic field sensor;
    a compensation coil placed at least partially underneath the magnetic field sensor; and
    a reverse current generator coupled to the compensation coil and to the power supply, the reverse current generator operable to generate a second current in the compensation coil that is opposite the first current to generate a counter magnetic field for compensating electromagnetic interference (EMI) generated by the one or more voice coils in a frequency band which overlaps with an operating frequency band of the magnetic field sensor.

15. The system of claim 14, wherein the magnetic sensor is a multi-axis digital magnetometer and the compensation coil is placed underneath the magnetometer at a position that allows for compensation along a first axis of the multi-axis digital magnetometer by the counter magnetic field and at least partial cancelling of the counter magnetic field along at least a second axis of the multi-axis digital magnetometer.

16. The system of claim 14, wherein the magnetic sensor is a multi-axis digital magnetometer and the compensation coil is placed underneath the magnetometer at an offset from a center of the multi-axis magnetometer to allow maximum compensation along a first sense axis of the multi-axis magnetometer and minimum compensation along at least a second sense axis of the multi-axis magnetometer.

17. The system of claim 14, wherein at least one dimension of the compensation coil is coextensive with at least one dimension of an integrated circuit package housing the magnetic sensor.

18. The system of claim 14, wherein the magnetic field sensor is included in an integrated circuit package and a length of the compensation coil is extended beyond a package boundary so the compensation coil overlies at least one sensor of the magnetic field sensor.

19. The system of claim 14, wherein the compensation coil is integrated into multiple layers of a printed circuit board (PCB) underneath the magnetic field sensor.

20. The system of claim 14, wherein in the system is included in an electronic device and further comprises:

a processor coupled to the magnetic sensor and operable to read magnetic field measurements provided by the magnetic field sensor; and memory coupled to the processor storing instructions, which, when executed by the processor, causes the processor to calculate a compass heading and present the compass heading on the electronic device using at least one of display, audio or force feedback.

* * * * *